United States Patent
Kim et al.

(10) Patent No.: US 10,977,144 B2
(45) Date of Patent: Apr. 13, 2021

(54) MEMORY SYSTEM AND METHOD OF OPERATING THE SAME

(71) Applicant: SK hynix Inc., Gyeonggi-do (KR)

(72) Inventors: Chi Eun Kim, Gyeonggi-do (KR); Soo Nyun Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 153 days.

(21) Appl. No.: 16/033,849

(22) Filed: Jul. 12, 2018

(65) Prior Publication Data

US 2019/0188101 A1    Jun. 20, 2019

(30) Foreign Application Priority Data

Dec. 18, 2017   (KR) .................. 10-2017-0174467

(51) Int. Cl.
  G06F 11/00      (2006.01)
  G06F 11/20      (2006.01)
(52) U.S. Cl.
  CPC ...... G06F 11/2094 (2013.01); G06F 2201/82 (2013.01)
(58) Field of Classification Search
  CPC ... G11C 29/44; G11C 29/4401; G11C 29/785; G11C 29/808; G11C 29/832; G11C 29/838; G11C 29/886; G06F 11/20; G06F 11/2094
  See application file for complete search history.

(56) References Cited

U.S. PATENT DOCUMENTS

| | | | |
|---|---|---|---|
| 2005/0144516 A1* | 6/2005 | Gonzalez | G11C 29/76 714/6.13 |
| 2008/0005530 A1* | 1/2008 | Nakano | G06F 12/0246 711/207 |
| 2011/0161727 A1* | 6/2011 | Lee | G06F 11/1662 714/6.12 |
| 2014/0006848 A1* | 1/2014 | Ramanujan | G11C 29/886 714/6.13 |
| 2018/0181476 A1* | 6/2018 | Gunnam | G06F 3/0665 |
| 2019/0065331 A1* | 2/2019 | Singidi | G11C 29/883 |
| 2019/0065332 A1* | 2/2019 | Ke | G06F 3/064 |
| 2019/0138414 A1* | 5/2019 | Shim | G06F 11/2094 |

FOREIGN PATENT DOCUMENTS

| | | |
|---|---|---|
| KR | 100463199 | 12/2004 |
| KR | 101660985 | 10/2016 |

* cited by examiner

Primary Examiner — Michael Maskulinski
(74) Attorney, Agent, or Firm — IP & T Group LLP

(57) ABSTRACT

A memory system includes: a nonvolatile memory device including a plurality of memory blocks and spare blocks; and a memory controller configured to control the nonvolatile memory device. The nonvolatile memory device may store spare information to any one block of the memory blocks or the spare blocks. When a bad block is detected from the memory blocks, the nonvolatile memory device replaces the bad block with any one of the spare blocks according to the spare information.

16 Claims, 11 Drawing Sheets

MEMORY SYSTEM AND METHOD OF OPERATING THE SAME

CROSS-REFERENCE TO RELATED APPLICATION

The present application claims priority under 35 U.S.C. § 119(a) to Korean patent application number 10-2017-0174467, filed on Dec. 18, 2017, the disclosure of which is herein incorporated by reference in its entirety.

BACKGROUND

1. Field of Invention

Various embodiments of the present disclosure generally relate to a memory system and a method of operating the memory system and, more particularly, to a memory system capable of replacing a bad block generated during an operation of the memory system with a normal block, and a method of operating the memory system.

2. Description of Related Art

A memory system may include a plurality of memory devices configured to store data, and a memory controller provided to perform communication between a host and the memory devices.

Each of the memory devices may include a plurality of planes. Each of the planes may include a plurality of memory blocks.

For more efficient management of the memory devices, memory systems have been proposed that organize the memory blocks in super blocks, each of which is formed of two or more memory blocks. Such memory systems may operate the memory devices on the basis of the super blocks.

SUMMARY

Various embodiments of the present disclosure are directed to a memory system capable of easily replacing a bad block generated during an operation of the memory system with a normal block, and a method of operating the memory system.

An embodiment of the present disclosure provides a memory system including: a nonvolatile memory device including a plurality of memory blocks and spare blocks; and a memory controller configured to control the nonvolatile memory device. The nonvolatile memory device may store spare information to any one block of the memory blocks or the spare blocks. When a bad block is detected from the memory blocks, the nonvolatile memory device may replace the bad block with any one of the spare blocks according to the spare information.

An embodiment of the present disclosure provides a method of operating a memory system, including: separating memory blocks configured to perform various operations from spare blocks configured not to perform the operations; designating any one block of the spare blocks as a start queue address; and replacing, when a bad block is detected form the memory blocks, the bad block with the spare block designated as the start queue address.

An embodiment of the present disclosure provides a memory system including: a plurality of ways; and a memory controller configured to control the ways. Spare information of the ways may be stored in some of the ways. When a bad block is detected from memory blocks included in the ways, the ways may replace the bad block with a spare block included in the ways according to the spare information and transmit mapping information of the replaced spare block to the memory controller. The memory controller may store, to a buffer memory, the mapping information to be updated according to the spare information.

An embodiment of the present disclosure provides a memory system comprising: a memory device including one or more memory planes, each having first and second memory block groups; and a controller suitable for controlling the memory device to replace a bad memory block in the first memory block group with an empty memory block in the second memory block group in each plane according to address information of empty memory blocks in the second memory block group, wherein the address information includes pointers respectively representing addresses of first and last empty memory blocks for the replacement, and wherein the controller updates the address information at each time of the replacement.

DETAILED DESCRIPTION

Figure 1:
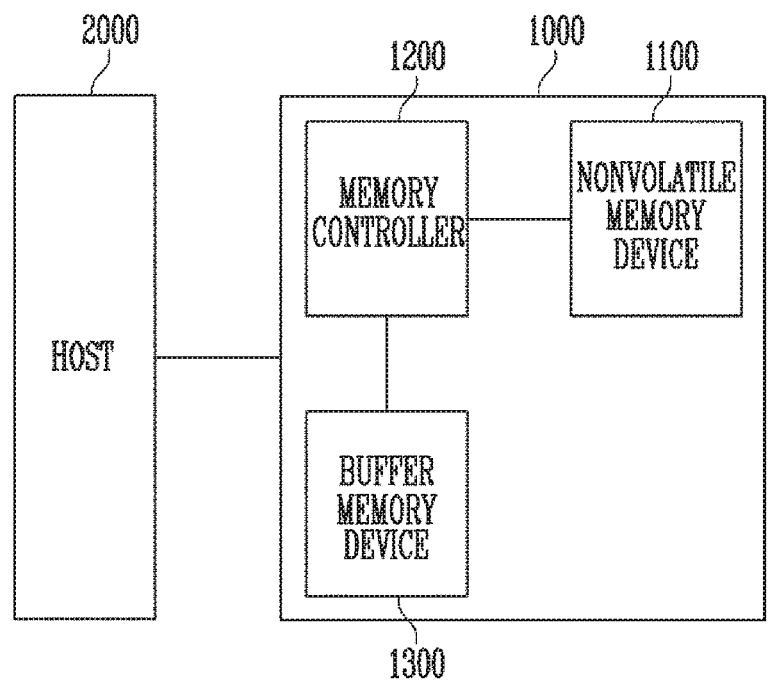
FIG. 1 is a diagram illustrating a memory system operatively coupled to a host in accordance with an embodiment of the present disclosure.

Example embodiments of the disclosure of the present invention will now be described more fully hereinafter with reference to the accompanying drawings; however, it is noted that the present invention may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present.

Hereinafter, embodiments will be described with reference to the accompanying drawings. Embodiments are described herein with reference to cross-sectional illustrations that are schematic illustrations of embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements.

Terms such as "first" and "second" may be used to describe various components, but they should not limit the various components. Those terms are only used for differentiating a component from other components. For example, a first component may be referred to as a second component, and a second component may be referred to as a first component and so forth without departing from the spirit and scope of the present disclosure. Furthermore, "and/or" may include any one of or a combination of the components mentioned.

Furthermore, a singular form may include a plural from as long as it is not specifically mentioned in a sentence. Furthermore, "include/comprise" or "including/comprising" are used interchangeably in the specification to represent that one or more components, steps, operations, and elements may exist or added.

Furthermore, unless defined otherwise, all the terms used in this specification including technical and scientific terms have the same meanings as would be generally understood by those skilled in the related art. The terms defined in generally used dictionaries should be construed as having the same meanings as would be construed in the context of the related art, and unless clearly defined otherwise in this specification, should not be construed as having idealistic or overly formal meanings.

It is also noted that in this specification, "connected/coupled" refers to one component not only directly coupling another component but also indirectly coupling another component through an intermediate component. On the other hand, "directly connected/directly coupled" refers to one component directly coupling another component without an intermediate component.

FIG. 1 is a diagram illustrating a memory system 1000 in accordance with an embodiment of the present disclosure.

Referring to FIG. 1, the memory system 1000 may include a nonvolatile memory device 1100 which retains stored data even when power is turned off, a buffer memory device 1300 configured to temporarily store data, and a memory controller 1200 configured to control the nonvolatile memory device 1100 and the buffer memory device 1300 under the control of a host 2000 operatively coupled to the memory system 1000.

The host 2000 may communicate with the memory system 1000 using at least one of various communication methods such as a universal serial bus (USB), a serial AT attachment (SATA), a serial attached SCSI (SAS), a high speed intership (HSIC), a small computer system interface (SCSI), a peripheral component interconnection (PCI), a PCI express (PCIe), a nonvolatile memory express (NVMe), a universal flash storage (UFS), a secure digital (SD), multimedia card (MMC), an embedded MMC (eMMC), a dual in-line memory module (DIMM), a registered DIMM (RDIMM), and a load reduced DIMM (LRDIMM).

The memory controller 1200 may control an overall operation of the memory system 1000 and data exchange between the host 2000 and the nonvolatile memory device 1100. For instance, the memory controller 1200 may control the nonvolatile memory device 1100 to program or read data in response to a request of the host 2000. Furthermore, the memory controller 1200 may store information about main memory blocks and sub-memory blocks included in the nonvolatile memory device 1100 and may select the nonvolatile memory device 1100 so that a program operation may be performed on the main memory blocks or the sub-memory blocks depending on the amount of data loaded for the program operation. In an embodiment, the nonvolatile memory device 1100 may be or include a flash memory.

The memory controller 1200 may control data exchange between the host 2000 and the buffer memory device 1300 or temporarily store system data for controlling the nonvolatile memory device 1100 to the buffer memory device 1300. The buffer memory device 1300 may be used as an operation memory, a cache memory, or a buffer memory of the memory controller 1200. The buffer memory device 1300 may store codes and commands to be executed by the memory controller 1200. The buffer memory device 1300 may store data to be processed by the memory controller 1200.

The memory controller 1200 may temporarily store a data input from the host 2000 to the buffer memory device 1300, and then transmit the data temporarily stored in the buffer memory device 1300 to the nonvolatile memory device 1100 and store it thereto. Furthermore, the memory controller 1200 may receive data and a logical address from the host 2000 and convert the logical address into a physical address indicating a region in which the data is to be actually stored to the nonvolatile memory device 1100. The memory controller 1200 may store, in the buffer memory device 1300, a logical-to-physical address mapping table indicating a mapping relationship between logical addresses and physical addresses.

In an embodiment, the buffer memory device 1300 may be or include a double data rate synchronous dynamic random-access memory (DDR SDRAM), a DDR4 SDRAM, a low power double data rate4 (LPDDR4) SDRAM, a graphics double data rate (GDDR) SDRAM, a low power DDR (LPDDR), or a rambus dynamic random access memory (RDRAM).

Figure 2:
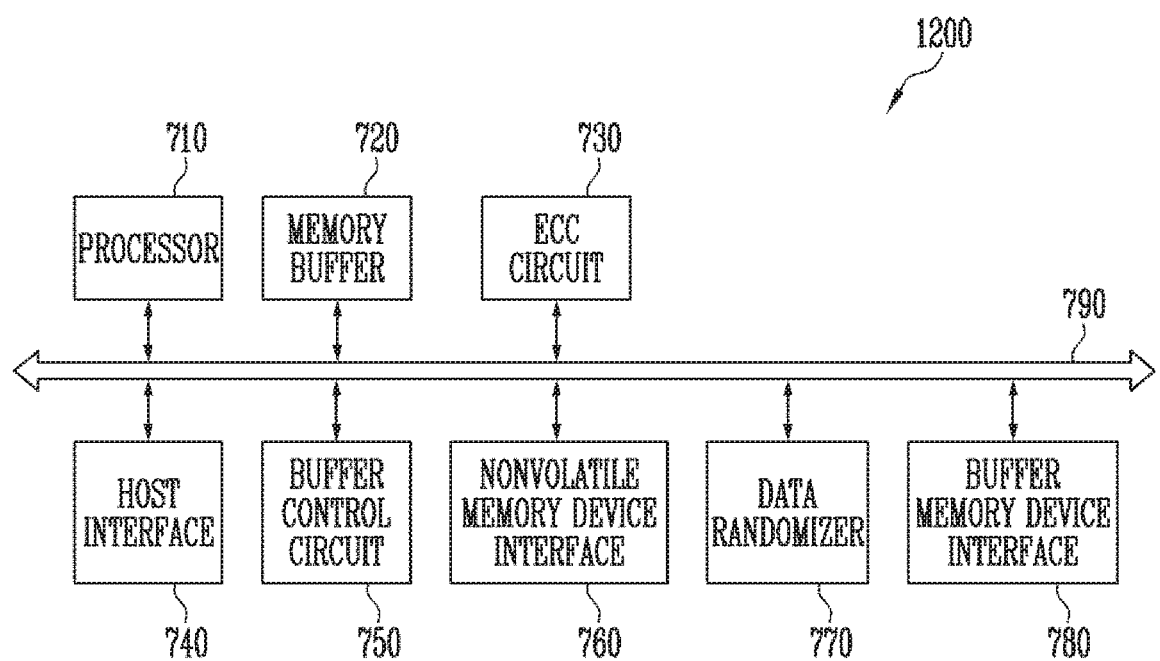
FIG. 2 is a diagram illustrating an example of a memory controller employed in the memory system shown in FIG. 1.

FIG. 2 is a diagram illustrating an example of the memory controller 1200 of FIG. 1.

Referring to FIG. 2, the memory controller 1200 may include a processor 710, a memory buffer 720, an error correction code (ECC) circuit 730, a host Interface 740, a buffer control circuit 750, a nonvolatile memory device interface 760, a data randomizer 770, a buffer memory device interface 780, and a bus 790.

The bus 790 may provide a channel between components of the memory controller 1200.

The processor 710 may control an overall operation of the memory controller 1200 and perform a logical operation. The processor 710 may communicate with the external host 2000 through the host interface 740, and communicate with the nonvolatile memory device 1100 through the nonvolatile memory device interface 760. Furthermore, the processor 710 may communicate with the buffer memory device 1300 through the buffer memory device interface 780. The processor 710 may control the memory buffer 720 through the buffer control circuit 750. The processor 710 may use the memory buffer 720 as an operation memory, a cache memory, or a buffer memory to control the operation of the memory system 1000.

The processor 710 may queue a plurality of commands inputted from the host 2000 according to a multi-queue operation. Then, the processor 710 may successively transmit the queued commands to the nonvolatile memory device 1100.

The memory buffer 720 may be used as an operation memory, a cache memory, or a buffer memory of the processor 710. The memory buffer 720 may store codes and commands to be executed by the processor 710. The memory buffer 720 may store data to be processed by the processor 710. The memory buffer 720 may be or include a static RAM (SRAM) or a dynamic RAM (DRAM).

The ECC circuit 730 may perform error correction. The ECC circuit 730 may perform ECC encoding based on data to be written to the nonvolatile memory device 1100 through the nonvolatile memory device interface 760. ECC encoded data may be transmitted to the nonvolatile memory device 1100 through the nonvolatile memory device interface 760. The ECC circuit 730 may perform ECC decoding for data received from the nonvolatile memory device 1100 through the nonvolatile memory device interface 760. In an embodiment, (not shown) the ECC circuit 730 may be included in the nonvolatile memory device interface 760 as a component of the nonvolatile memory device interface 760.

The host interface 740 may communicate with the external host 2000 under the control of the processor 710. The host interface 740 may perform communication using at least one of various communication methods such as a universal serial bus (USB), a serial AT attachment (SATA), a serial attached SCSI (SAS), a high speed interchip (HSIC), a small computer system interface (SCSI), a peripheral component interconnection (PCI), a PCI express (PCIe), a nonvolatile memory express (NVMe), a universal flash storage (UFS), a secure digital (SD), multiMedia card (MMC), an embedded MMC (eMMC), a dual in-line memory module (DIMM), a registered DIMM (RDIMM), and a load reduced DIMM (LRDIMM).

The buffer control circuit 750 may control the memory buffer 720 under control of the processor 710.

The nonvolatile memory device interface 760 may communicate with the nonvolatile memory device 1100 under the control of the processor 710. The nonvolatile memory device interface 760 may communicate a command, an address, and data with the nonvolatile memory device 1100 through a channel.

In an embodiment, the memory controller 1200 may not include the memory buffer 720 or the buffer control circuit 750. For example, in such an embodiment, the processor 710 may load codes to control the operation of the memory controller 1200 from a nonvolatile memory device (e.g., a read only memory) provided in the memory controller 1200. Or, the processor 710 may load codes from the nonvolatile memory device 1100 through the nonvolatile memory device interface 760.

The data randomizer 770 may randomize data or de-randomize the randomized data. The data randomizer 770 may perform a data randomization operation for data to be written to the nonvolatile memory device 1100 through the nonvolatile memory device interface 760. Randomized data may be transmitted to the nonvolatile memory device 1100 through the nonvolatile memory device interface 760. The data randomizer 770 may perform a data de-randomization operation for data received from the nonvolatile memory device 1100 through the nonvolatile memory device interface 760. For example, the data randomizer 770 may be included in the nonvolatile memory device interface 760 as a component of the nonvolatile memory device interface 760.

For example, the bus 790 of the memory controller 1200 may be classified into a control bus and a data bus. The data bus may transmit data in the memory controller 1200. The control bus may transmit control information such as a command and an address in the memory controller 1200. The data bus and the control bus may be separated from each other and may neither interfere with each other nor affect each other. The data bus may be coupled to the host interface 740, the buffer controller 750, the ECC circuit 730, the nonvolatile memory device interface 760, and the buffer memory device interface 780. The control bus may be coupled to the host interface 740, the processor 710, the buffer control circuit 750, the nonvolatile memory device interface 760, and the buffer memory device interface 780.

The buffer memory device interface 780 may communicate with the buffer memory device 1300 under the control of the processor 710. The buffer memory device interface 780 may communicate a command, an address, and data with the buffer memory device 1300 through a channel.

Figure 3:
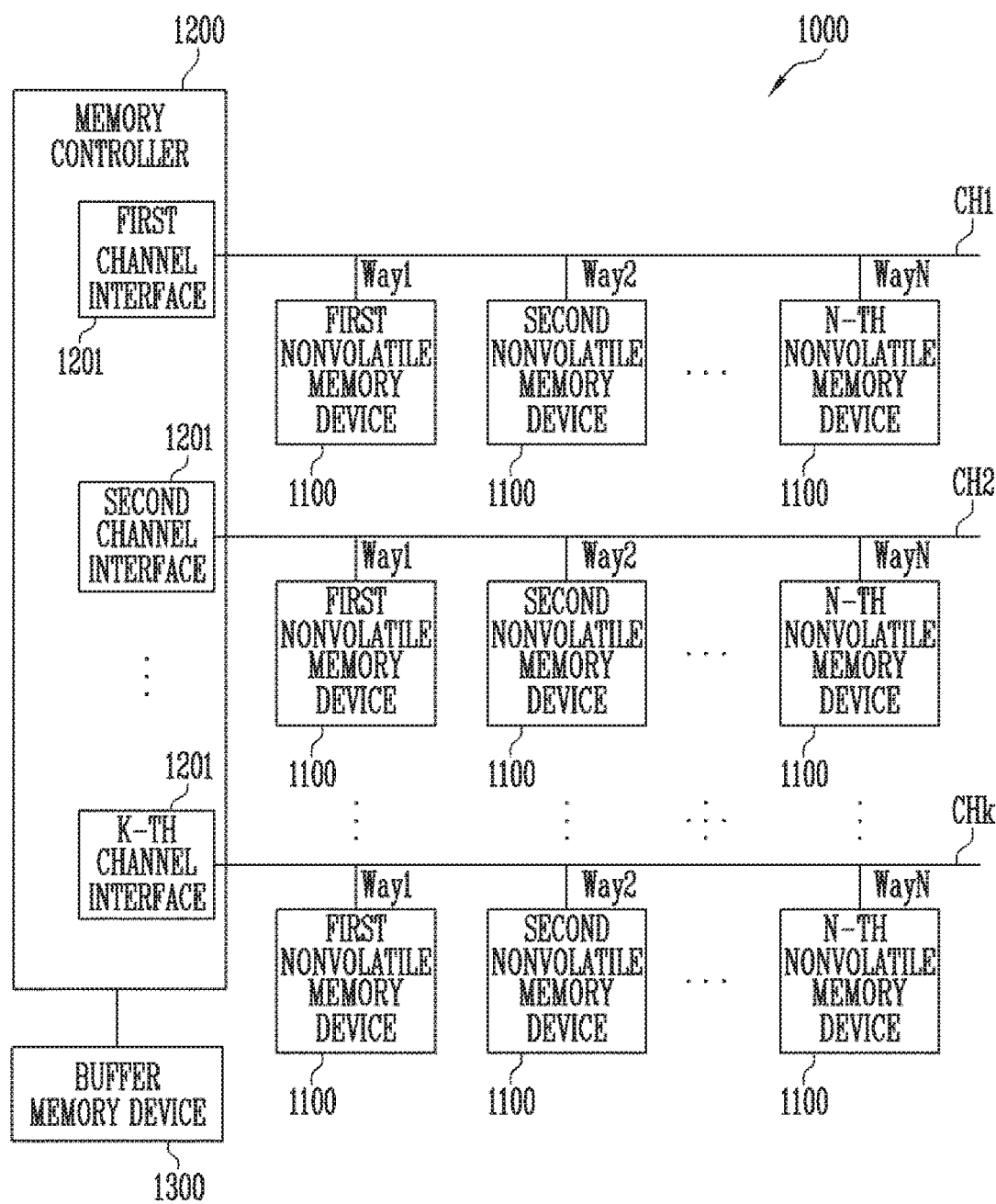
FIG. 3 is a diagram illustrating a memory system in accordance with an embodiment of the present disclosure.

FIG. 3 is a diagram illustrating an example of the memory system 1000 in accordance with an embodiment of the present disclosure.

Referring to FIG. 3, the memory controller 1200 may communicate with the nonvolatile memory devices 1100 through channels CH1 to CHk. The memory controller 1200 may include a plurality of channel interfaces 1201. Each of the channels CH1 to CHk may be coupled to a corresponding one of the channel interfaces 1201. For example, the first channel CH1 may be coupled to the first channel interface 1201, the second channel CH2 may be coupled to the second channel interface 1201, and the k-th channel CHk may be coupled to the k-th channel interface 1201. Each of the channels CH1 to CHk may be coupled to one or more nonvolatile memory devices 1100. The nonvolatile memory devices 1100 that are coupled to different channels may operate independently from each other. For example, a nonvolatile memory device 1100 coupled to the first channel CH1 and a nonvolatile memory device 1100 coupled to the second channel CH2 may operate independently from each other. For instance, the memory controller 1200 may communicate data or a command through the first channel CH1 with a nonvolatile memory device 1100 coupled to the first channel CH1 and, in parallel, communicate data or a command through the second channel CH2 with a nonvolatile memory device 1100 coupled to the second channel CH2.

Each of the channels CH1 to CHk may be coupled to a plurality of nonvolatile memory devices 1100. The nonvolatile memory devices 1100 may be coupled to each channel through different respective ways. For example, N nonvolatile memory devices 1100 may be coupled to each channel, and each nonvolatile memory device 1100 may form a different way. For example, first to N-th nonvolatile memory devices 1100 may be coupled to the first channel CH1. The first nonvolatile memory device 1100 may form a first way Way1, the second nonvolatile memory device 1100 may form a second way Way2, and the N-th nonvolatile memory device 1100 may form an N-th way WayN. In a variation of the illustrated embodiment, two or more nonvolatile memory devices 1100 may form a single way.

The first to N-th nonvolatile memory devices 1100 coupled to the first channel CH1 may communicate data or a command with the memory controller 1200 in a sequential or series communication rather than in parallel (i.e., simultaneous communication) with the memory controller 1200 because the first to N-th nonvolatile memory devices 1100 share the first channel CH1. For example, while the memory controller 1200 sends, through the first channel CH1, data to the first nonvolatile memory device 1100 forming the first way Way1 of the first channel CH1, each of the second to N-th nonvolatile memory device 1100 forming the second to N-th ways Way2 to WayN of the first channel CH1 cannot communicate data or a command with the memory controller 1200 through the first channel CH1. Generally, while any one of the first to N-th nonvolatile memory devices 1100 sharing the first channel CH1 occupies the first channel CH1, the other nonvolatile memory devices 1100 coupled to the first channel CH1 cannot use the first channel CH1.

The first nonvolatile memory device 1100 forming the first way Way1 of the first channel CH1 and the first nonvolatile memory device 1100 forming the first way Way1 of the second channel CH2 may independently communicate with the memory controller 1200. In other words, while the memory controller 1200 communicates data with the first nonvolatile memory device 1100 forming the first way Way1 of the first channel CH1 through the first channel CH1 and the first channel interface 1201, simultaneously the memory controller 1200 may communicate data with the first nonvolatile memory device 1100 forming the first way Way1 of the second channel CH2 through the second channel CH2 and the second channel interface 1201.

Figure 4:
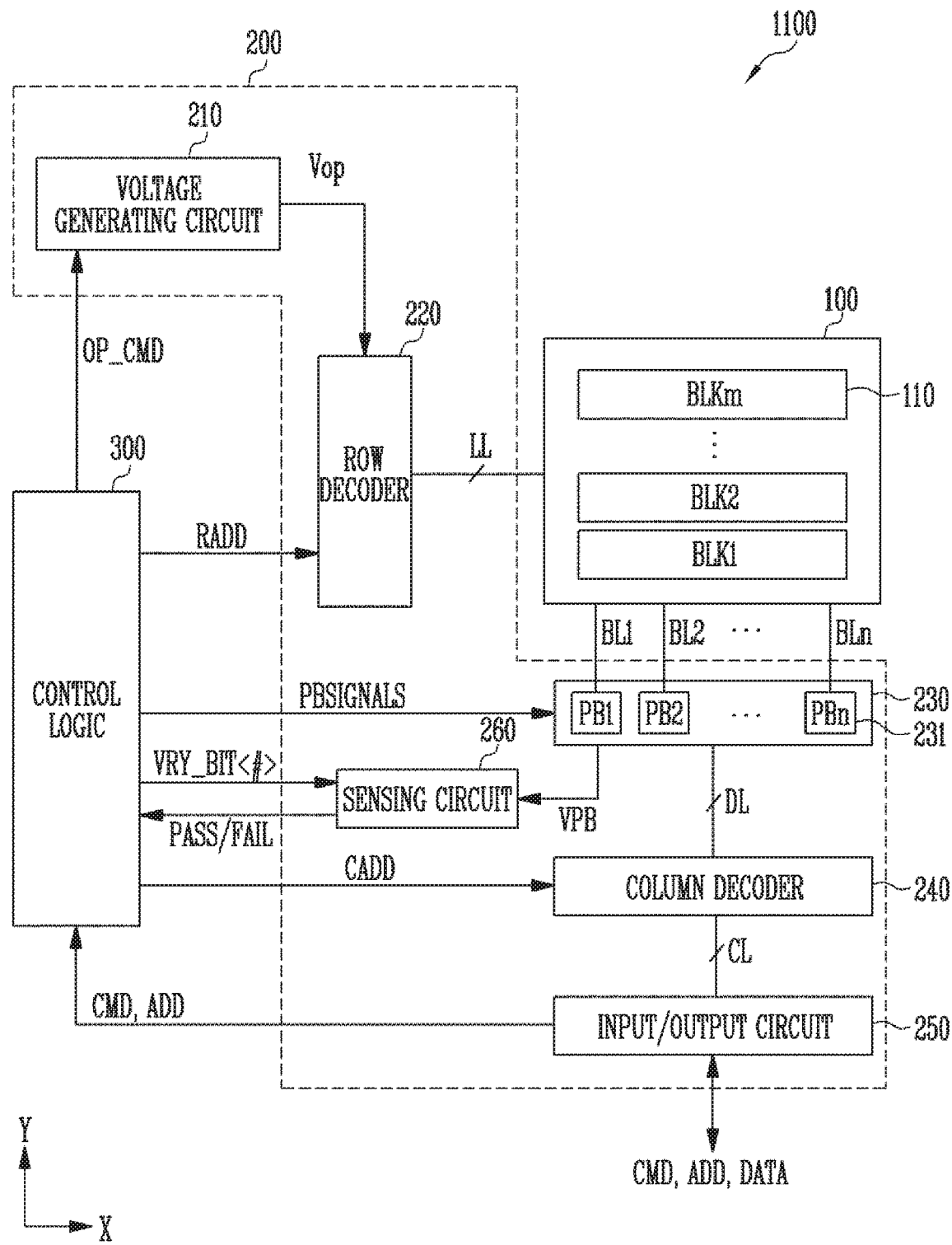
FIG. 4 is a diagram illustrating an example of a nonvolatile memory device shown in FIG. 1.

FIG. 4 is a diagram illustrating an example of the nonvolatile memory device 1100 of FIG. 1.

Referring to FIG. 4, the nonvolatile memory device 1100 may include a memory cell array 100 comprising a plurality of memory cells configured to store data. The nonvolatile memory device 1100 may include peripheral circuits 200 configured to perform a program operation for storing data to the memory cell array 100, a read operation for outputting the stored data, and an erase operation for erasing the stored data. The nonvolatile memory device 1100 may include a control logic 300 configured to control the peripheral circuits 200 under control of the memory controller (1200 of FIG. 1).

The memory cell array 100 may include a plurality of memory blocks BLK1 to BLKm (110; m is a positive integer). Local lines LL and bit lines BL1 to BLn (n is a positive integer) may be coupled to each of the memory blocks BLK1 to BLKm (110). For example, the local lines LL may include a first select line, a second select line, and a plurality of word lines arranged between the first and second select lines. Furthermore, the local lines LL may include dummy lines arranged between the first select line and the word lines and between the second select line and the word lines. Here, the first select line may be a source select line, and the second select line may be a drain select line. For example, the local lines LL may include word lines, drain and source select lines, and source lines. For example, the local lines LL may further include dummy lines. For example, the local lines LL may further include pipelines. The local lines LL may be coupled to each of the memory blocks BLK1 to BLKm (110). The bit lines BL1 to BLn may be coupled in common to the memory blocks BLK1 to BLKm (110). The memory blocks BLK1 to BLKm (110) may be embodied in a two or a three-dimensional structure. For example, in the memory blocks 110 having a two-dimensional structure, the memory cells may be arranged in a direction parallel to a substrate. For example, in the memory blocks 110 having a three-dimensional structure, the memory cells may be stacked in a direction perpendicular to the substrate.

The peripheral circuits 200 may perform program, read and erase operations on a selected memory block 110 under control of the control logic 300. For example, under control of the control logic 300, the peripheral circuits 200 may supply a verify voltage and pass voltages to the first select line, the second select line, and the word lines, selectively discharge the first select line, the second select line, and the word lines, and verify memory cells coupled to a selected word line among the word lines. For instance, the peripheral circuits 200 may include a voltage generating circuit 210, a row decoder 220, a page buffer group 230, a column decoder 240, an input/output circuit 250, and a sensing circuit 260.

The voltage generating circuit 210 may generate various operating voltages Vop to be used for the program, read, and erase operations in response to an operating signal OP_CMD. Furthermore, the voltage generating circuit 210 may selectively discharge the local lines LL in response to an operating signal OP_CMD. For example, the voltage generating circuit 210 may generate a program voltage, a verify voltage, pass voltages, a turn-on voltage, a read voltage, an erase voltage, a source line voltage, etc. under control of the control logic 300.

The row decoder 220 may transmit operating voltages Vop to local lines WL coupled to a selected memory block 110 in response to a row address RADD.

The page buffer group 230 may include a plurality of page buffers PB1 to PBn (231) coupled to the bit lines BL1 to BLn. The page buffers PB1 to PBn (231) may operate in response to page buffer control signals PBSIGNALS. For instance, the page buffers PB1 to PBn (231) may temporarily store data received through the bit lines BL1 to BLn or sense voltages or currents of the bit lines BL1 to BLn during a read or verify operation.

The column decoder 240 may transmit data between the input/output circuit 250 and the page buffer group 230 in response to a column address CADD. For example, the column decoder 240 may exchange data with the page buffers 231 through data lines DL or exchange data with the input/output circuit 250 through column lines CL.

The input/output circuit 250 may transmit a command CMD or an address ADD received from the memory controller (1200 of FIG. 1) to the control logic 300, or exchange data DATA with the column decoder 240.

During the read or verify operation, the sensing circuit 260 may generate a reference current in response to an enable bit VRY_BIT<#>, and may compare a sensing voltage VPB received from the page buffer group 230 with a reference voltage generated by the reference current and output a pass signal PASS or a fail signal FAIL.

The control logic 300 may output an operating signal OP_CMD, a row address RADD, page buffer control signals PBSIGNALS, and an enable bit VRY_BIT<#> in response to a command CMD and an address ADD and thus control the peripheral circuits 200. In addition, the control logic 300 may determine whether target memory cells have passed or failed a verify operation in response to a pass or fail signal PASS or FAIL.

In the operation of the nonvolatile memory device 1100, each memory block 110 may be the basic unit of an erase operation. In other words, a plurality of memory cells included in each memory block 110 may be simultaneously erased rather than being selectively erased.

Figure 5:
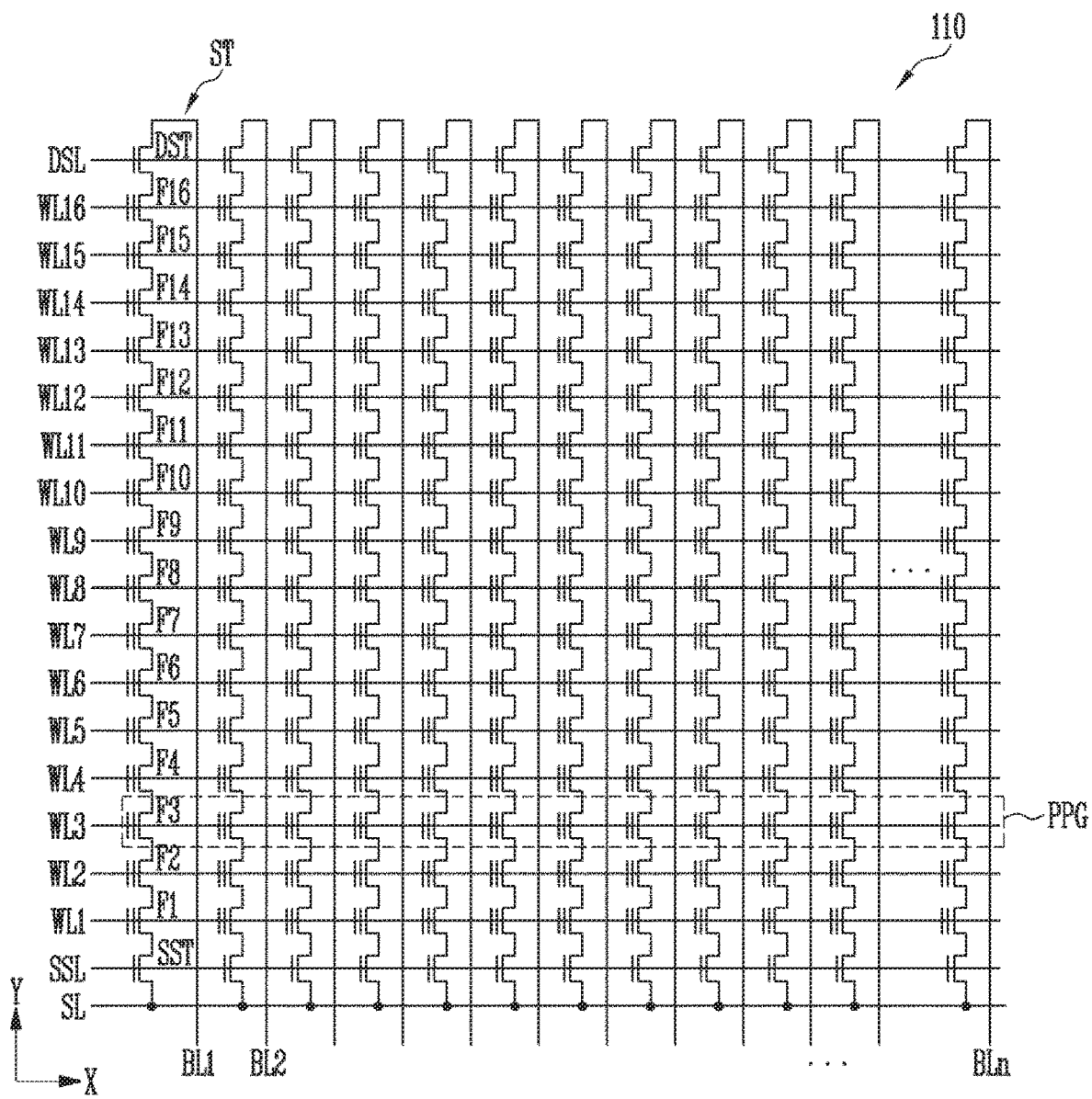
FIG. 5 is a diagram illustrating an example of a memory block employed in the nonvolatile memory device shown in FIG. 4.

FIG. 5 is a diagram illustrating an example of the memory block 110 of FIG. 4.

Referring to FIG. 5, in the memory block 110, a plurality of word lines arranged parallel to each other may be coupled between a first select line and a second select line. Here, the first select line may be a source select line SSL, and the second select line may be a drain select line DSL. In more detail, the memory block 110 may include a plurality of strings ST coupled between the bit lines BL1 to BLn and the source line SL. The bit lines BL1 to BLn may be respectively coupled to the strings ST, and the source lines SL may be coupled in common to the strings ST. The strings ST may have the same configuration; therefore, the string ST that is coupled to the first bit line BL1 will be described in detail by way of example.

The string ST may include a source select transistor SST, a plurality of memory cells F1 to F16, and a drain select transistor DST which are coupled in series to each other between the source line SL and the first bit line BL1. At least one source select transistor SST and at least one drain select transistor DST may be included in each string ST, and a larger number of memory cells than the number of memory cells F1 to F16 shown in the drawing may be included in each string ST.

A source of the source select transistor SST may be coupled to the source line SL, and a drain of the drain select transistor DST may be coupled to the first bit line BL1. The memory cells F1 to F16 may be coupled in series between the source select transistor SST and the drain select transistor DST. Gates of the source select transistors SST included in different strings ST may be coupled to the source select line SSL, gates of the drain select transistors DST may be coupled to the drain select line DSL, and gates of the memory cells F1 to F16 may be coupled to the plurality of word lines WL1 to WL16. Among the memory cells included in different strings ST, a group of memory cells coupled to each word line may be referred to as a physical page PPG. Therefore, the number of physical pages PPG included in the memory block 110 may correspond to the number of word lines WL1 to WL16.

Each memory cell may store 1-bit data. This memory cell is typically called a single level cell SLC. In this case, each physical page PPG may store data of a singe logical page LPG. Data of each logical page LPG may include data bits corresponding to the number of cells included in a single physical page PPG. Each memory cell may store 2- or more-bit data. This memory cell is typically called a multi-level cell MLC. In this case, each physical page PPG may store data of two or more logical pages LPG.

A plurality of memory cells included in each physical page PPG may be simultaneously programmed. In other words, the nonvolatile memory device 1100 may perform a program operation on a physical page (PPG) basis. A plurality of memory cells included in each memory block may be simultaneously erased. In other words, the nonvolatile memory device 1100 may perform an erase operation on a memory block basis. For example, to update some data stored in one memory block 110, an updating operation may be performed as follows: the entire data stored in the memory block 110 is read; data needed to be updated among the entire data is changed; and then the entire data is programmed to another memory block 110 again. This is because in the case where each memory block 110 is the basic unit of the erase operation in the operation of the nonvolatile memory device 1100, it is impossible to erase only some of the data stored in the memory block 110 and program new data thereto again. Such characteristics of the memory device may be one of the factors that contribute to making a garbage collection operation complex. Furthermore, when an error occurs in some memory cells included in a memory block 110 due to deterioration in use, the associated memory block 110 may be regarded as a bad block, and all the memory cells included in the bad block may be managed not to be used.

Figure 6:
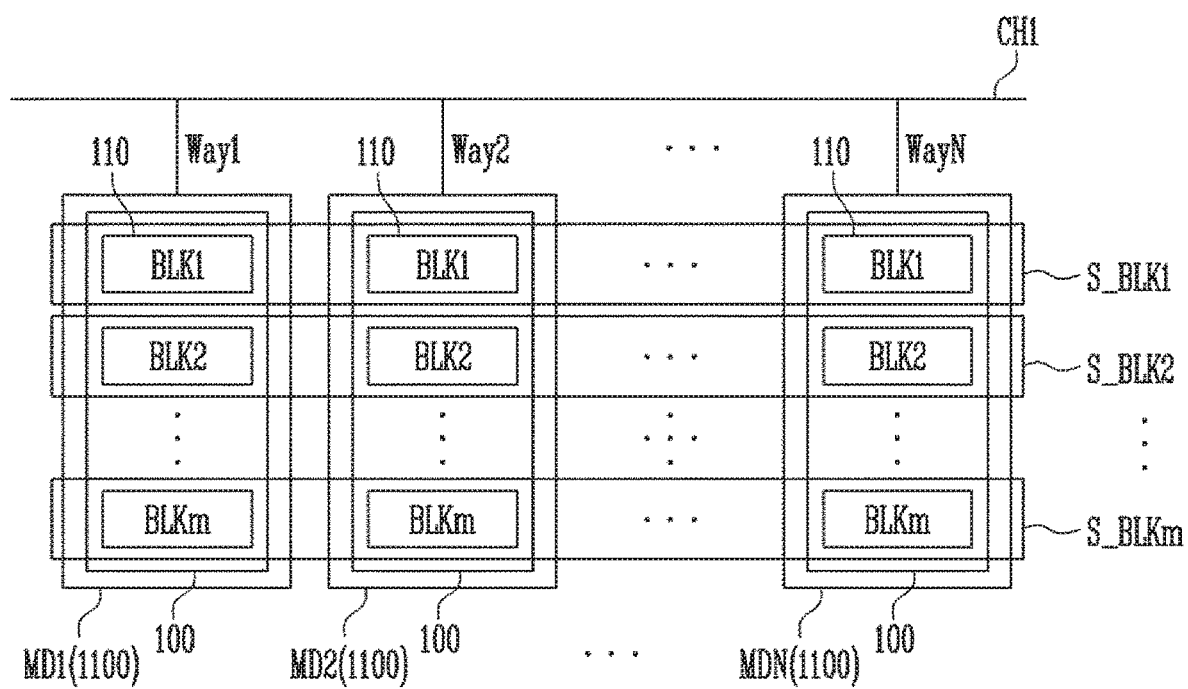
FIG. 6 is a diagram illustrating an arrangement of super blocks in accordance with an embodiment of the present disclosure.

FIG. 6 is a diagram illustrating an example of an arrangement of super blocks.

Referring to FIG. 6, each of the ways Way1 to WayN that form the first channel CH1 may include at least one nonvolatile memory device 1100. As described above, each nonvolatile memory device 1100 may include a plurality of memory blocks BLK1 to BLKm (110). An erase operation may be independently performed on each of the memory blocks BLK1 to BLKm (110). A plurality of memory cells included in each memory block 110 may be simultaneously erased.

Each of the super blocks S_BLK1 to S_BLKm may include a group of memory blocks, each memory block selected from a different nonvolatile memory device 1100 coupled to a different way. For example, each of the super blocks S_BLK1 to S_BLKm may include a plurality of memory blocks, each memory block being from a different nonvolatile memory device coupled to a different way. For instance, the first super block S_BLK1 (500) may include a first memory block BLK1 (110) included in a first nonvolatile memory device MD1 (1100) which is coupled to the first way Way1, a first memory block BLK1 (110) included in a second nonvolatile memory device MD2 (1100) which is coupled to the second way Way2, and so on and so forth a first memory block BLK1 (110) included in an N-th nonvolatile memory device MDN (1100) which is coupled to the N-th way WayN. In the same manner, the second super block S_BLK2 (500) may include second memory blocks BLK2 (110) which are respectively included in the first to N-th nonvolatile memory devices MD1 to MDN (1100) that are respectively coupled to the first to N-th ways Way1 to WayN. Likewise, the m-th super block S_BLKm (500) may include m-th memory blocks BLKm (110) which are respectively included in the first to N-th nonvolatile memory devices MD1 to MDN (1100) that are respectively coupled to the first to N-th ways Way1 to WayN.

The memory blocks BLK1 to BLKm that are included in each of the super blocks S_BLK1 to S_BLKm are physically different memory blocks, but may be operated logically as a single super block. In other words, a plurality of memory blocks (any one group of memory blocks selected from among BLK1 to BLKm) which is included in any one selected from among the super blocks S_BLK1 to S_BLKm may be simultaneously programmed or erased. The memory system 1000 may perform a program operation or an erase operation on a super block basis, thus making it possible to improve the performance of the program operation or the erase operation. In addition, the memory system 1000 may perform an operation such as a garbage collection operation or a wear leveling operation on a super block basis, thus making it possible to more efficiently manage the memory blocks.

All the memory blocks BLK1 to BLKm included in the first to N-th nonvolatile memory devices MD1 to MDN (1100) may be included in the super blocks S_BLK1 to S_BLKm, however, preferably, some memory blocks may be included in the super blocks S_BLK1 to S_BLKm while the remaining memory blocks may be used as spare blocks for replacing those memory blocks that may become bad blocks during the lifetime of the memory system.

Hence, in a preferred embodiment, some memory blocks may be included in a super block group, and any remaining memory blocks may be included in a spare block group. Here, the term "super block group" refers to all memory blocks used to form a plurality of super blocks, and the term "spare block group" refers to a group formed of all spare blocks, i.e., memory blocks used only for the replacement of bad blocks. The super block group and the spare block group will be described in detail with reference to FIG. 7.

Figure 7:
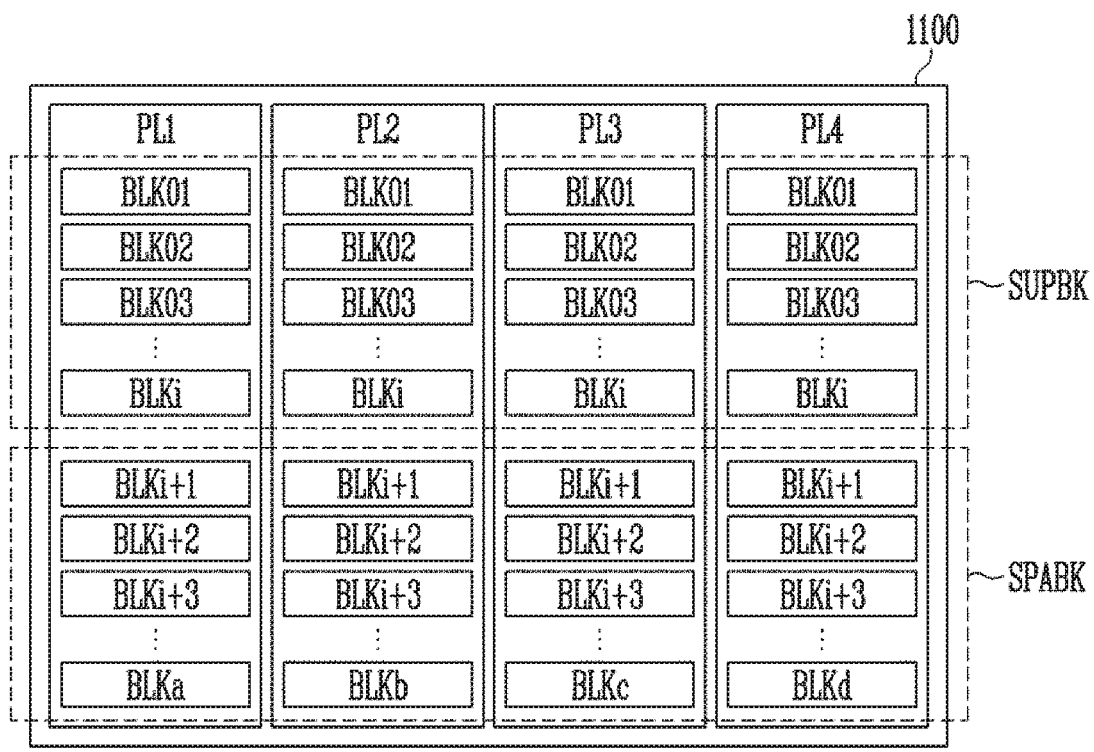
FIG. 7 is a diagram illustrating an arrangement of super blocks group and a spare block group in accordance with an embodiment of the present disclosure.

FIG. 7 is a diagram lustrating a super block group and a spare block group in accordance with an embodiment of the present disclosure.

In FIG. 7, one nonvolatile memory device 1100 including four planes, i.e., first to fourth planes PL1 to PL4, will be described by way of example. In the foregoing description with reference to FIG. 6, there has been described an example where memory blocks included in different nonvolatile memory devices 1100 are included in each supper block, and, in the following description with reference to FIG. 7, any one of the nonvolatile memory devices will be described by way of example.

Hence, for example, when first to fourth planes PL1 to PL4 are included in the nonvolatile memory device 1100, some memory blocks included in each of the first to fourth planes PL1 to PL4 may be included in a super block group SUPBK, and the remaining memory blocks may be included in a spare block group SPABK. For example, first to i-th memory blocks BLK01 to BLKi included in each of the first to fourth planes PL1 to PL4 may be included in the super block group SUPBK. The other memory blocks including (i+1)-th memory blocks BLKi+1 may be included in the spare block group SPABK. Also, only memory blocks that have been determined to be normal blocks (i.e., good blocks) may be included in the spare block group SPABK. For example, blocks that have been determined to be bad blocks in a test performed after the nonvolatile memory device 1100 has been manufactured may not be included in the spare block group SPABK. The number of bad memory blocks among the memory blocks included in each of the first to fourth planes PL1 to PL4 may vary. As a result, the number of memory blocks of each plane that may be included in the spare block group SPABK may vary. In the present embodiment, (i+1)-th to a-th memory blocks BLKi+1 to BLKa may be included in the spare block group SPABK of the first plane PL1, (i+1)-th to b-th memory blocks BLKi+1 to BLKb may be included in the spare block group SPABK of the second plane PL2, (i+1)-th to c-th memory blocks BLKi+1 to BLKc may be included in the spare block group SPABK of the third plane PL3, and (i+1)-th to d-th memory blocks BLKi+1 to BLKd may be included in the spare block group SPABK of the fourth plane PL4. Here, "a", "b", "c", and "d" may be the same or different positive integers.

Each of the memory blocks BLKi+1 to BLKa, BLKb, BLKc, and BLKd included in the spare block group SPABK may be used as a replacement block when a bad block is generated in use of the memory blocks BLK01 to BLKi included in the super block group SUPBK.

A method of replacing, when a bad block is generated, the bad block with a memory block included in the spare block group SPABK will be described by way of example with reference to the (i+1)-th to a-th memory blocks BLKi+1 to BLKa included in the spare block group SPABK of the first plane PL1.

Figure 8:
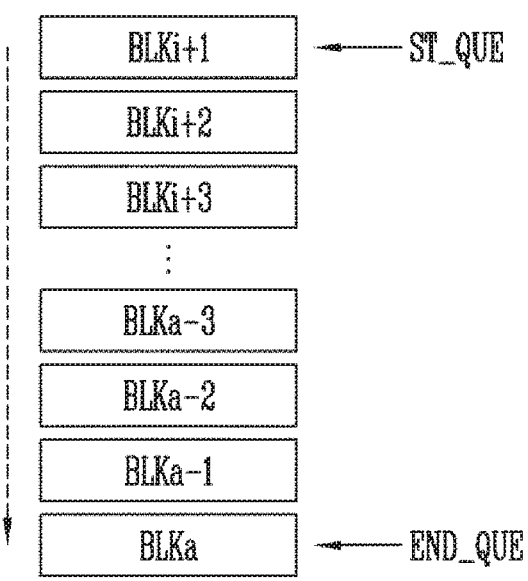
FIG. 8 is a diagram illustrating a method of setting a start queue address and an end queue address in accordance with an embodiment of the present disclosure.

FIG. 8 is a diagram illustrating a method of setting a start queue address and an end queue address in accordance with an embodiment of the present disclosure.

Referring to FIG. 8, an address of any one memory block among the (i+1)-th to a-th memory blocks BLKi+1 to BLKa included in the spare block group SPABK may be set to a start queue address ST_QUE, and an address of another memory block may be set to an end queue address END_QUE. The start queue address ST_QUE and the end queue address END_QUE may be information about locations of the memory blocks.

In detail, when a bad block is generated among the memory blocks included in the super block group SUPBK, the bad block may be replaced with any one of the (i+1)-th to a-th memory blocks BLKi+1 to BLKa included in the spare block group SPABK. In the present embodiment, to reduce the time it takes to perform a replacement operation, an address of any one memory block among the (i+1)-th to a-th memory blocks BLKi+1 to BLKa may be set to the start queue address ST_QUE, and an address of another memory block may be set to the end queue address END_QUE.

Hereinbelow, the method of replacing the bad block generated in the super block group SPABK will be described in detail.

Figure 9:
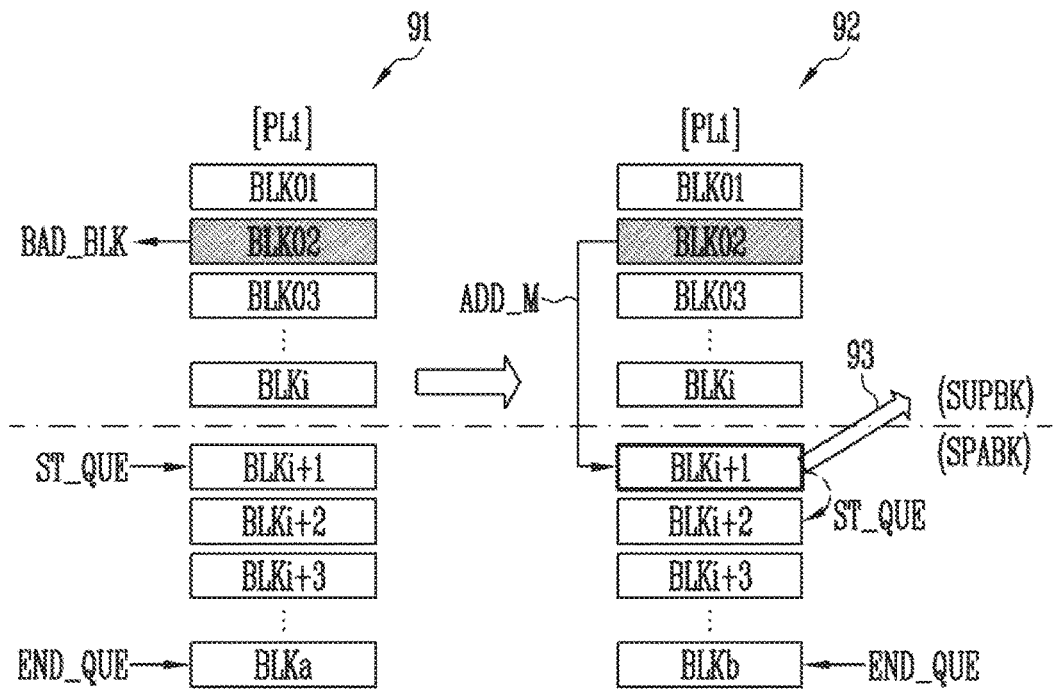
FIG. 9 is a diagram illustrating in detail a method of replacing a bad block with a normal block in accordance with an embodiment of the present disclosure.

FIG. 9 is a diagram illustrating in detail a method of replacing a bad block with a normal block in accordance with an embodiment of the present disclosure.

The method of replacing a bad block with a normal block in the first plane PL1 will be described by way of example with reference to FIG. 9. The address of the (i+1)-th memory block BLKi+1 among the (i+1)-th to a-th memory blocks BLKi to BLKa included in the spare block group SPABK may be set to the start queue address ST_QUE, and the address of the a-th memory block BLKa may be set to the end queue address END_QUE. When a bad block is generated in the super block group SUPBK, the memory block having the address designated as the start queue address ST_QUE may be selected as a block substituting for the bad block. The memory block having the address designated as the end queue address END_QUE may be lastly selected among the (i+1)-th to a-th memory blocks BLKi to BLKa included in the spare block group SPABK.

During the operation of the nonvolatile memory device, when the second memory block BLK02 among the first to i-th memory blocks BLK01 to BLKi included in the super block group SUPBK of the first plane PL1 is determined to be a bad block BAD_BLK (as shown by reference numeral 91), the (i+1)-th memory block BLKi+1 having the address designated as the start queue address ST_QUE among the i+1 to a-th memory blocks BLKi to BLKa included in the same first plane PL1 may be mapped (as shown by reference ADD_M) to a block substituting for the second memory block BLK02 (as shown by reference numeral 92). In other words, because the second memory block BLK02 has become a bad block, the (i+1)-th memory block BLKi+1 may be selected to work instead of the second memory block BLK2 in the first plane PL1. Therefore, as shown by reference numeral 93, the (i+1)-th memory block BLKi+1 may be included in the super block group SUPBK in lieu of the second memory block BLK02.

Since the (i+1)-th memory block BLKi+1 has been included in the super block group SUPBK, an address of a subsequent memory block may be designated as a start queue address ST_QUE. For example, an address of the i+2-th memory block BLKi+2 may be designated as a next start queue address ST_QUE.

Information about the start queue address ST_QUE and the end queue address END_QUE may be stored in some of the memory blocks included in the nonvolatile memory device and may be updated each time the start queue address ST_QUE is changed. Hereinafter, a method of managing spare information including the information about the start queue address ST_QUE and the end queue address END_QUE will be described in detail.

Figure 10:
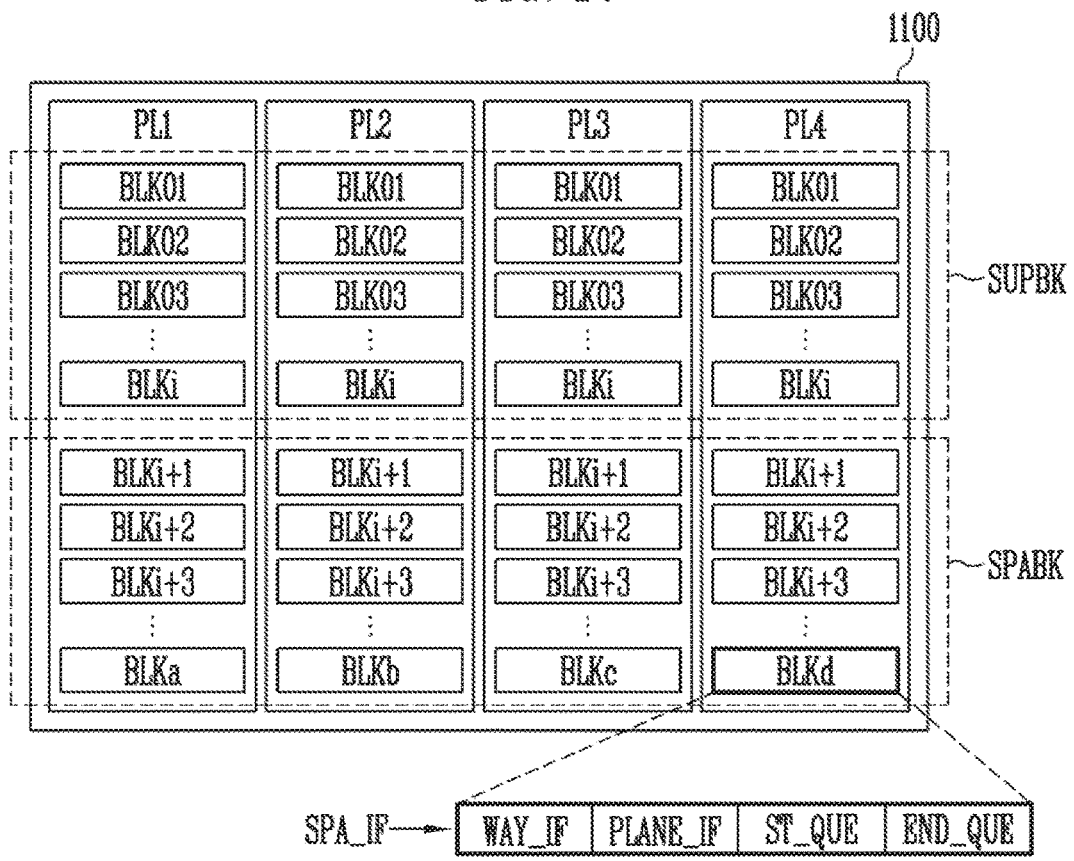
FIG. 10 is a diagram illustrating a method of managing spare information in accordance with an embodiment of the present disclosure.

FIG. 10 is a diagram illustrating method of managing spare information SPA_IF in accordance with an embodiment of the present disclosure.

Referring to FIG. 10, the spare information SPA_IF may be stored and updated to any one plane (e.g., the fourth plane PL4) among the first to fourth planes PL1 to PL4 included in any one nonvolatile memory device 110. The spare information SPA_IF may be stored and updated to the super block group SUPBK or the spare block group SPABK. Hereinafter, a description will be made for an embodiment in which the spare information SPA_IF is stored in the spare block group SPABK.

The spare information SPA_IF may be stored and updated to the d-th memory block BLKd included in the fourth plane PL4. For example, the spare information SPA_IF to be stored and updated to the d-th memory block BLKd may include information about a spare block for the ways Way1 to Wayn included in the memory system 1000 of FIG. 3. Here, the spare block means a memory block not designated as a replacement block among the normal memory blocks.

The spare information SPA_IF may include way information WAY_IF, plane information PLANE_IF, the start queue address ST_QUE and the end queue address END_QUE. For example, the spare information SPA_IF may be stored to any one way among the ways Way1 to WayN coupled to the same channel among the channels CH1 to CHk of FIG. 3. In this case, a way address, a plane address, and a memory block address in which the spare information SPA_IF is stored may be stored to the buffer memory device 1300 of the memory system 1000 of FIG. 1. When a bad block is generated during the operation of a selected way, the memory controller 1200 may receive the spare information SPA_IF from a selected memory block according to the way address, the plane address, and the memory block address that are stored in the buffer memory device 1300. Thereafter, the memory controller 1200 may replace the bad block with the spare block according to the start queue address ST_QUE included in the spare information SPA_IF.

In this case, the way information WAY_IF, the plane information PLANE_IF, and the start queue address ST_QUE and the end queue address END_QUE may be stored in the spare information SPA_IF. The way information WAY_IF may include respective addresses of the ways coupled to each channel. The plane information PLANE_IF may include addresses of the planes of each way. The start queue address ST_QUE may include an address of a block corresponding to the first turn among the spare blocks included in each plane. For example, the start queue address ST_QUE may be applied to an address of a block to be first designated as a replacement block among the spare blocks. The end queue address END_QUE may include an address of a block corresponding to the last turn among the spare blocks included in each plane.

Figure 11:
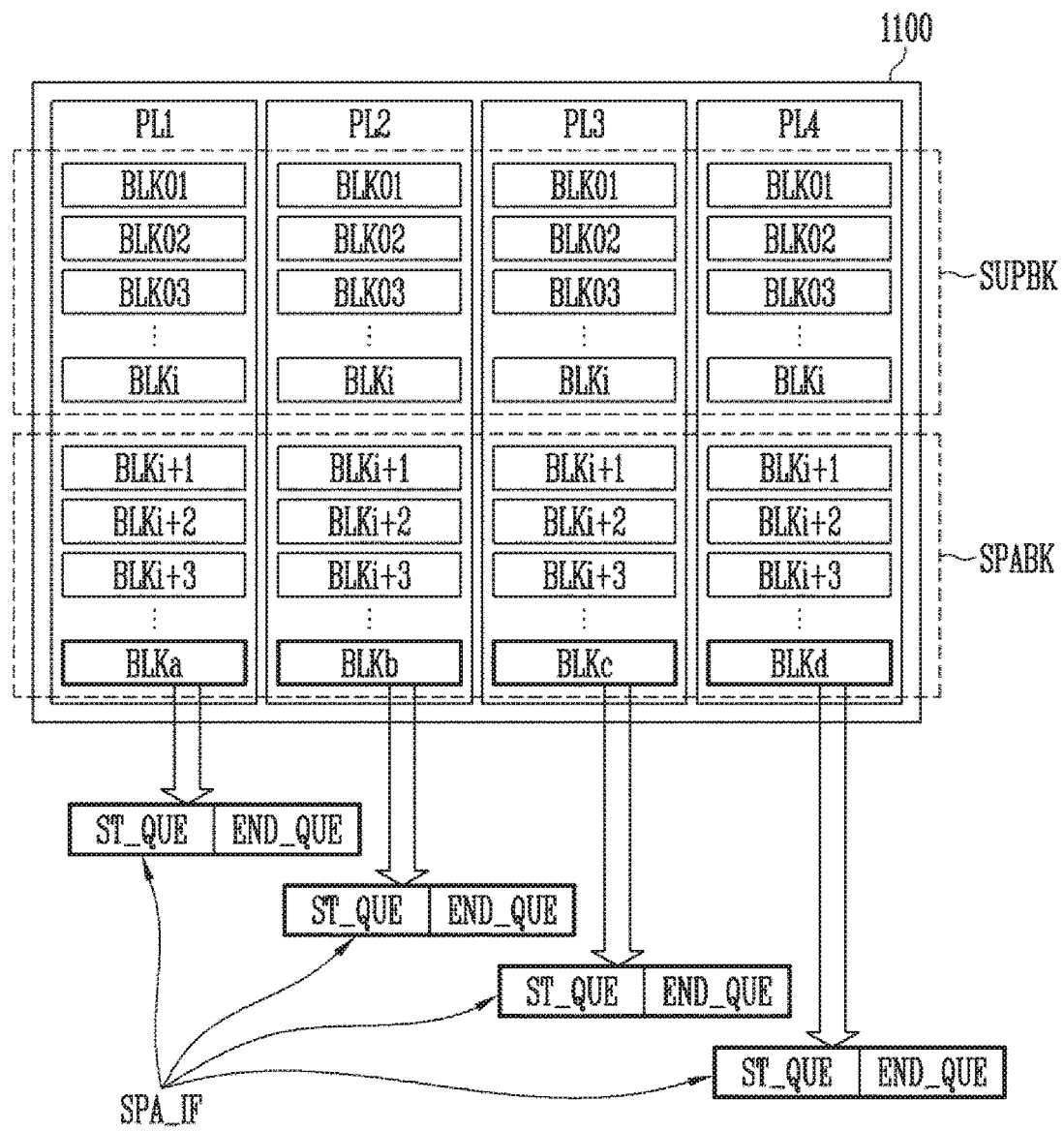
FIG. 11 is a diagram illustrating a method of managing spare information in accordance with an embodiment of the present disclosure.

FIG. 11 is a diagram illustrating a method of managing the spare information SPA_IF in accordance with an embodiment of the present disclosure.

Referring to FIG. 11, the spare information SPA_IF may be stored and updated to each of the planes. For example, the spare information SPA_IF of the first plane PL1 may be stored to the a-th memory block BLKa of the first plane PL1. The spare information SPA_IF of the first plane PL1 may include an address of a memory block corresponding to the start queue address ST_QUE and an address of a memory block corresponding to the end queue address END_QUE among the (i+1)-th to a-th memory blocks BLKi+1 to BLKa. The spare information SPA_IF of the second plane PL2 may store an address of a memory block corresponding to the start queue address ST_QUE and an address of a memory block corresponding to the end queue address END_QUE among the (i+1)-th to b-th memory blocks BLKi+1 to BLKb. The spare information SPA_IF of the third plane PL3 may store an address of a memory block corresponding to the start queue address ST_QUE and an address of a memory block corresponding to the end queue address END_QUE among the (i+1)-th to c-th memory blocks BLKi+1 to BLKc. The spare information SPA_IF of the fourth plane PL4 may store an address of a memory block corresponding to the start queue address ST_QUE and an address of a memory block corresponding to the end queue address END_QUE among the (i+1)-th to d-th memory blocks BLKi+1 to BLKd.

As such, if the spare information SPA_IF is stored to each of the first to fourth planes PL1 to PL4, the nonvolatile memory device 1100 may replace, when a bad block is generated in the super block group SUPBK, the bad block with a spare block according to the spare information SPA_IF stored in each plane even without control of the memory controller 1200. For example, when a bad block is detected, the control logic 300 of FIG. 4 included in the nonvolatile memory device 1100 may read the spare information SPA_IF from the plane from which the bad block has been detected. The control logic 300 may then transmit an address of a spare block substituted according to the read spare information to the memory controller 1200. In other words, the control logic 300 may transmit the mapping information in which the bad block has been replaced with the normal block to the memory controller 1200.

Figure 12:
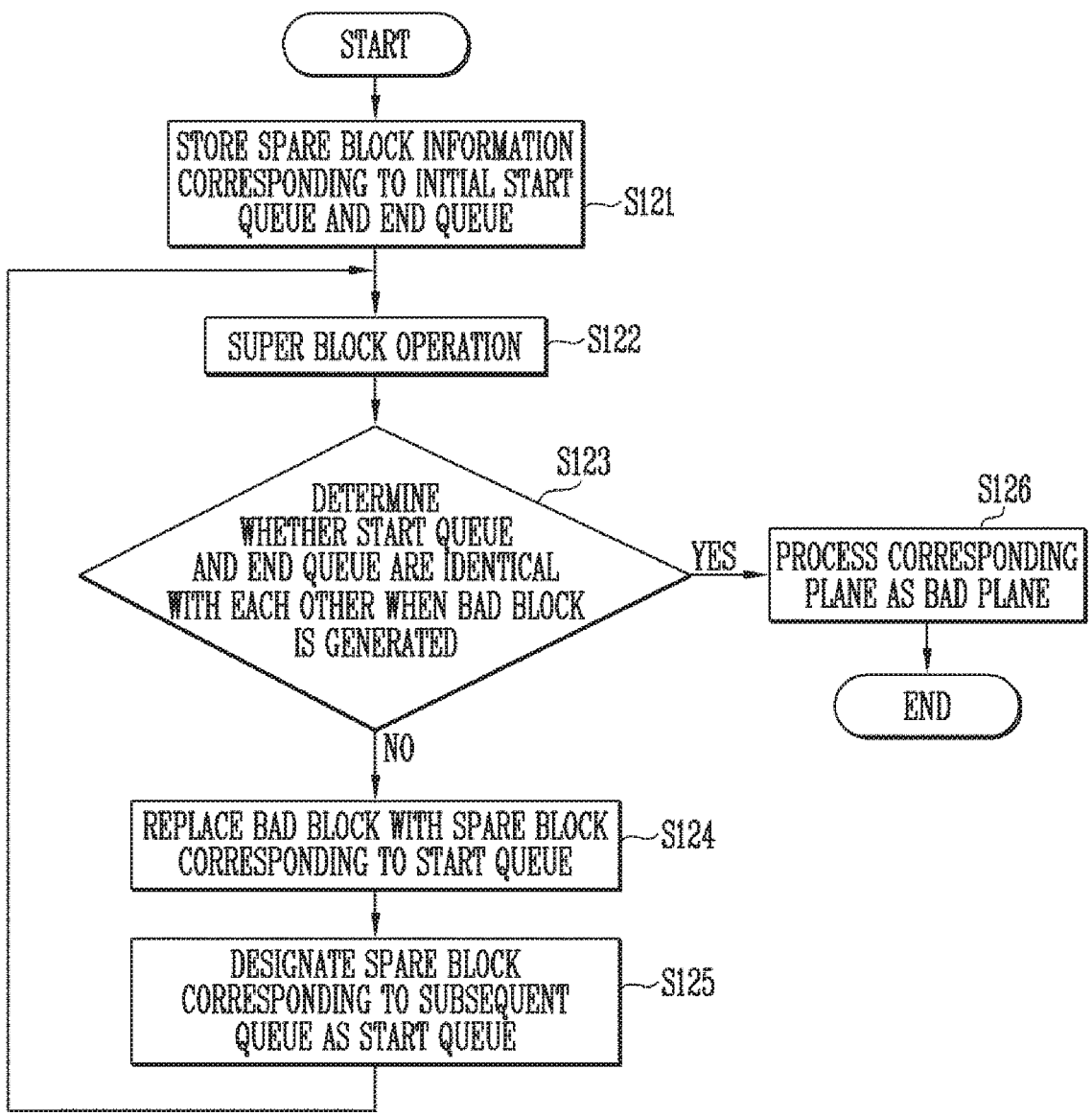
FIG. 12 is a flowchart illustrating a method of operating a memory system in accordance with an embodiment of the present disclosure.

FIG. 12 is a flowchart illustrating a method of operating the memory system in accordance with an embodiment of the present disclosure.

Referring to FIG. 12, spare block information SPA_IF corresponding to an initial start queue address ST_QUE (also referred to as start queue) and an end queue address END_QUE (also referred to as end queue) may be stored to a selected memory block of a selected plane, at step S121. For example, among spare blocks determined to be normal blocks after an initial test of the nonvolatile memory device 1100, the initial start queue address ST_QUE may be applied to the first spare block, and the end queue address END_QUE may be applied to the last spare block.

The nonvolatile memory device 1100 may perform an operation on a super block under control of the memory controller 1200, at step S122. For instance, an operation may be a program operation, or a read operation. It is noted that a spare block cannot be selected as part of a super block on which an operation is performed.

If a bad block is generated in a supper block during an operation of the nonvolatile memory device 1100, the control logic 300 included in the nonvolatile memory device 1100 may determine whether the start queue address ST_QUE and the end queue address END_QUE are identical, at step S123. For example, the control logic 300 may read the spare information SPA_IF from the memory block to which the spare information SPA_IF has been stored, and determine whether the start queue address ST_QUE and the end queue address END_QUE included in the spare information SPA_IF are identical.

If it is determined that the start queue address ST_QUE and the end queue address END_QUE are not identical ("NO" at step S123), the control logic 300 may then replace the bad block with a spare block corresponding to the start queue address ST_QUE, at step S124. For example, the control logic 300 may map the address of the bad block to the address of the substituted spare block and transmit this mapping information to the memory controller 1200. The memory controller 1200 may store the received mapping information to the buffer memory device 1300.

Then, since the spare block corresponding to the initial start queue address ST_QUE has been used to substitute for the bad block, a spare block having a subsequent queue address (i.e. address of the spare block subsequent to the spare block of the initial start queue address) is designated as a new start queue address ST_QUE at step S125. In other words, the spare information is updated to designate a new start queue address.

In this way, the nonvolatile memory device 1100 may replace the bad block generated during an operation thereof with a spare block, at steps S122 to S125.

If, at step S123, it is determined that the start queue address and the end queue address are identical ("YES" at step S123), the control logic 300 may then process the corresponding plane as a bad plane, at step S126. This is because when the start queue address and the end queue address become identical all the spare blocks have already been used to substitute for bad blocks and therefore there are no more spare blocks. In this case, because there is no spare block to substitute for the bad block, the corresponding plane which includes the bad block that cannot be replaced with a spare block may be processed as a bad plane. Alternatively, the plane may be processed such that only memory blocks other than the bad blocks may be operated as normal blocks.

Figure 13:
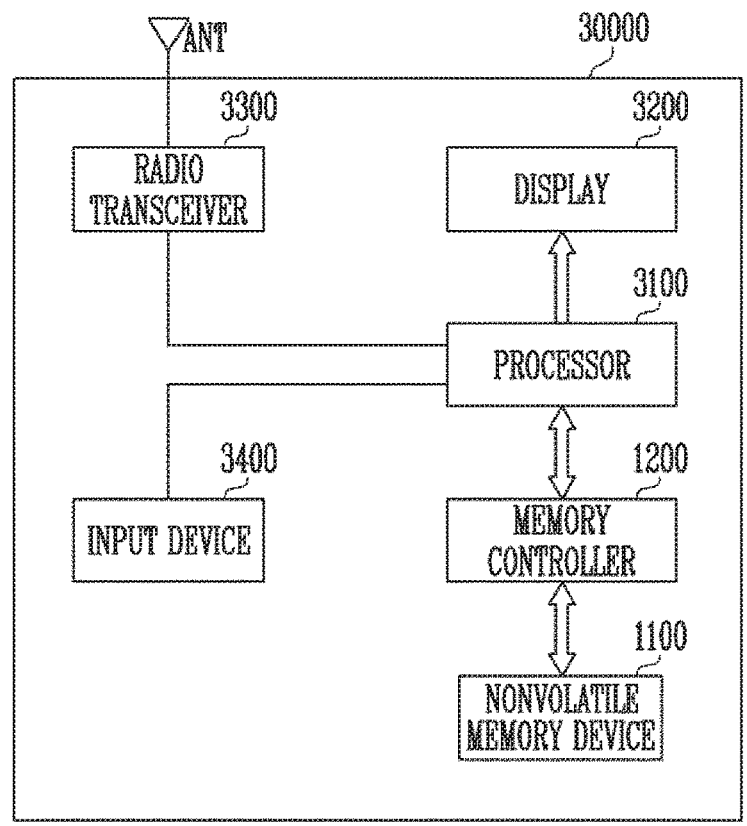
FIG. 13 is a diagram illustrating an example of the memory system including the memory controller shown in FIG. 2.

FIG. 13 is a diagram illustrating an example of a memory system 30000 including the memory controller 1200 shown in FIG. 2.

Referring to FIG. 13, the memory system 30000 may be embodied in a cellular phone, a smartphone, a tablet PC, a personal digital assistant (PDA) or a wireless communication device. The memory system 30000 may include a nonvolatile memory device 1100, and the memory controller 1200 configured to control the operation of the nonvolatile memory device 1100. The memory controller 1200 may control a data access operation, e.g., a program operation, an erase operation, or a read operation, of the nonvolatile memory device 1100 under control of a processor 3100.

Data programmed to the nonvolatile memory device 1100 may be transferred through a display 3200 under control of the memory controller 1200.

A radio transceiver 3300 may send and receive radio signals through an antenna ANT. For example, the radio transceiver 3300 may change a radio signal received through the antenna ANT into a signal that may be processed in the processor 3100. Therefore, the processor 3100 may process a signal output from the radio transceiver 3300 and transmit the processed signal to the memory controller 1200 or the display 3200. The memory controller 1200 may program a signal processed by the processor 3100 to the nonvolatile memory device 1100. Furthermore, the radio transceiver 3300 may change a signal outputted from the processor 3100 into a radio signal, and output the changed radio signal to an external device through the antenna ANT. An input device 3400 may be used to input a control signal for controlling the operation of the processor 3100 or data to be processed by the processor 3100. The input device 3400 may be embodied in a pointing device such as a touch pad and a computer mouse, a keypad a keyboard or a combination thereof. The processor 3100 may control the operation of the display 3200 such that data outputted from the memory controller 1200, data outputted from the radio transceiver 3300, or data outputted form the input device 3400 is outputted through the display 3200.

In an embodiment, the memory controller 1200 capable of controlling the operation of the nonvolatile memory device 1100 may be embodied as a part of the processor 3100 or a chip provided separately from the processor 3100.

Figure 14:
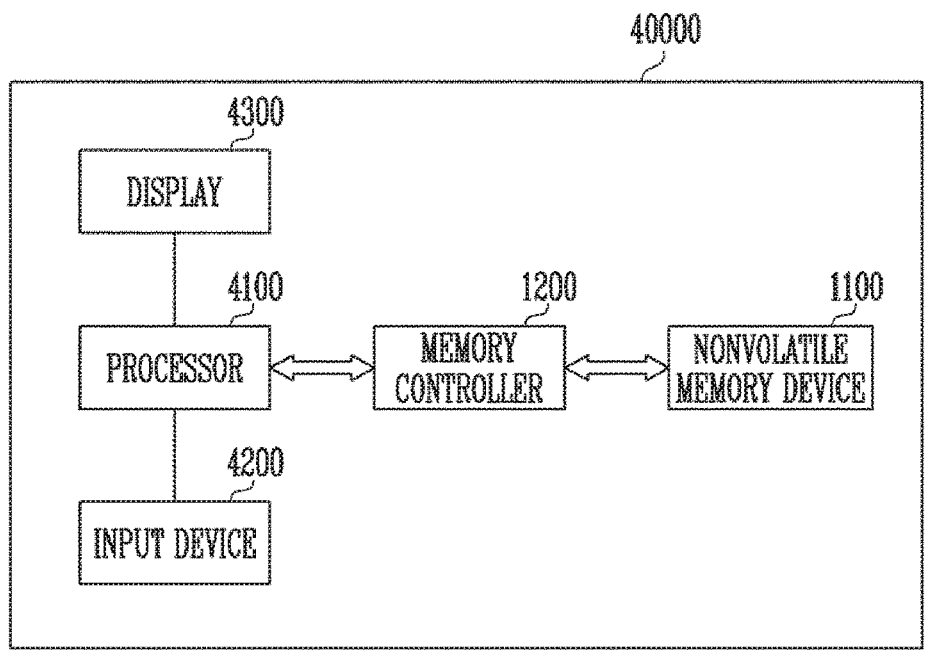
FIG. 14 is a diagram illustrating an example of the memory system including the memory controller shown in FIG. 2.

FIG. 14 is a diagram illustrating an example of a memory system 40000 including the memory controller 1200 shown in FIG. 2.

Referring to FIG. 14, the memory system 40000 may be embodied in a personal computer (PC), a tablet PC, a net-book, an e-reader, a personal digital assistant (PDA), a portable multimedia player (PMP), an MP3 player, or an MP4 player.

The memory system 40000 may includes a nonvolatile memory device 1100, and a memory controller 1200 configured to control the data processing operation of the nonvolatile memory device 1100.

A processor 4100 may output data stored in the nonvolatile memory device 1100 through a display 4300, according to data inputted from an input device 4200. For example, the input device 4200 may be embodied in a pointing device such as a touch pad or a computer mouse, a keypad, a keyboard or a combination thereof.

The processor 4100 may control the overall operation of the memory system 40000 and control the operation of the memory controller 1200. The memory controller 1200 capable of controlling the operation of the nonvolatile memory device 1100 may be embodied as a part of the processor 4100 or a chip provided separately from the processor 4100.

Figure 15:
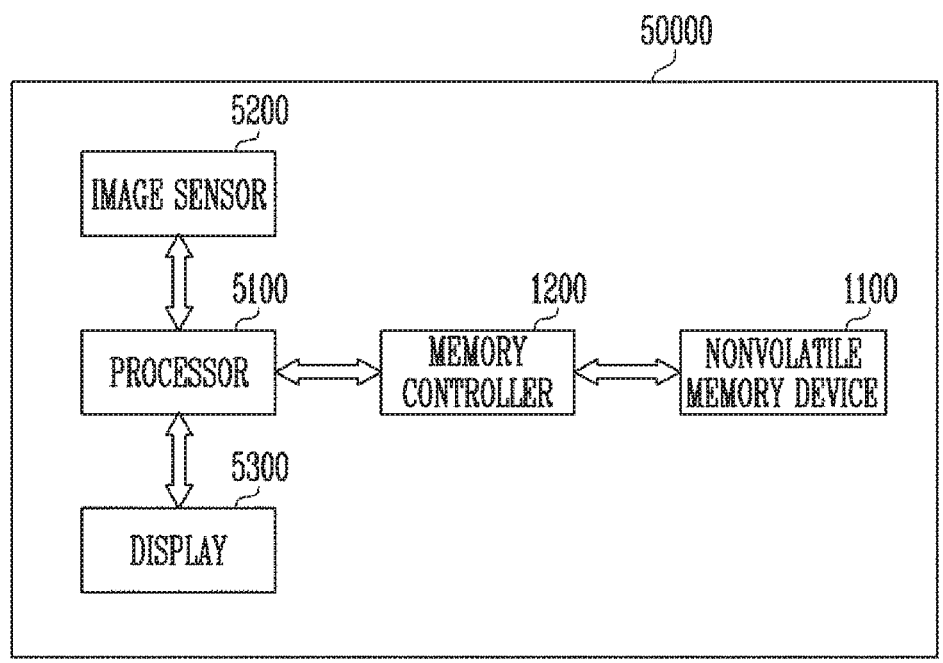
FIG. 15 is a diagram illustrating an example of the memory system including the memory controller shown in FIG. 2.

FIG. 15 is a diagram illustrating an example of a memory system 50000 including the memory controller 1200 shown in FIG. 2.

Referring to FIG. 15, the memory system 50000 may be embodied in an image processing device, e.g., a digital camera, a portable phone provided with a digital camera, a smartphone provided with a digital camera, a tablet PC provided with a digital camera, and the like.

The memory system 50000 may include a nonvolatile memory device 1100, and a memory controller 1200 capable of controlling a data processing operation, e.g., a program, erase, or read operation, of the nonvolatile memory device 1100.

An image sensor 5200 of the memory system 50000 may convert an optical image into digital signals. The converted digital signals may be transmitted to a processor 5100 or the memory controller 1200. Under control of the processor 5100, the converted digital signals may be transferred through a display 5300 or stored to the nonvolatile memory device 1100 through the memory controller 1200. Data stored to the nonvolatile memory device 1100 may be transferred through the display 5300 under control of the processor 5100 or the memory controller 1200.

In an embodiment, the memory controller 1200 capable of controlling the operation of the nonvolatile memory device 1100 may be embodied as a part of the processor 5100 or a chip provided separately from the processor 5100.

Figure 16:
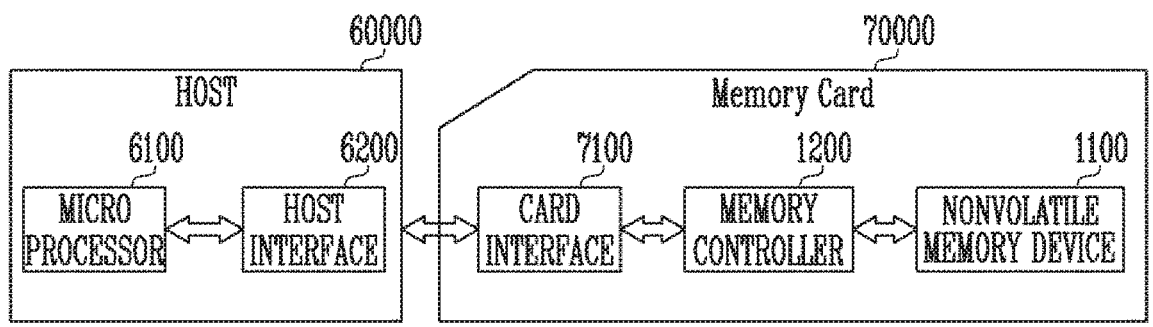
FIG. 16 is a diagram illustrating an example of the memory system including the memory controller shown in FIG. 2.

FIG. 16 is a diagram illustrating an example of a memory system 70000 including the memory controller 1200 shown in FIG. 2.

Referring to FIG. 16, the memory system 70000 may be embodied in a memory card or a smart card. The memory system 70000 may include a nonvolatile memory device 1100, a memory controller 1200, and a card interface 7100.

The memory controller 1200 may control data exchange between the nonvolatile memory device 1100 and the card interface 7100. In an embodiment, the card interface 7100 may be a secure digital (SD) card interface or a multi-media card (MMC) interface, but it is not limited thereto.

The card interface 7100 may interface data exchange between a host 60000 and the memory controller 1200 according to a protocol of the host 60000. In an embodiment, the card interface 7100 may support a universal serial bus (USB) protocol, and an inter-chip (IC)-USB protocol. Here, the card interface may refer to hardware capable of supporting a protocol which is used by the host 60000, software installed in the hardware, or a signal transmission method.

When the memory system 70000 is connected to a host interface 6200 of the host 60000 such as a PC, a tablet PC, a digital camera, a digital audio player, a cellular phone, console video game hardware or a digital set-top box, the host interface 6200 may perform data communication with the nonvolatile memory device 1100 through the card interface 7100 and the memory controller 1200 under control of a microprocessor 6100.

In accordance with various embodiments of the present disclosure, a bad block generated during an operation of a memory system may be easily replaced with a normal block. Because a memory controller or a buffer memory device manages in a nonvolatile memory device information about normal blocks to substitute for bad blocks, the capacity of the memory controller or the buffer memory device may be ensured.

Examples of embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A memory system comprising:
   a nonvolatile memory device including a plurality of planes each including memory blocks and spare blocks; and
   a memory controller configured to control the nonvolatile memory device,
   in response to a bad block being detected from the memory blocks, to replace the bad block with any one of the spare blocks according to spare information,
   wherein the any one of the spare blocks is included in an identical plane with the bad block,
   wherein the spare information includes a start queue address and an end queue address corresponding to the spare blocks included in each of the plurality of planes, and
   wherein each of the plurality of planes includes a block to store the spare information.

2. The memory system according to claim 1, wherein the nonvolatile memory device comprises:
   peripheral circuits configured to perform various operations on the memory blocks or the spare blocks included in the plurality of planes; and
   a control logic configured to control the peripheral circuits under control of the memory controller.

3. The memory system according to claim 2,
   wherein, in response to the bad block being detected from the memory blocks, the control logic compares the start queue address and the end queue address included in the spare information,
   wherein, in response to the start queue address and the end queue address not being identical with each other, the control logic replaces the bad block with a spare block corresponding to the start queue address, and
   wherein, in response to the start queue address and the end queue address being identical with each other, the control logic processes a plane including the bad block as a bad plane.

4. The memory system according to claim 1, wherein the spare information is updated in response to a status of the spare blocks.

5. The memory system according to claim 1, wherein the start queue address is an address of the any one of the spare blocks.

6. The memory system according to claim 5, wherein, in response to the any one of the spare blocks being replaced for the bad block, an address of a spare block corresponding to a subsequent turn is updated to be the start queue address.

7. The memory system according to claim 1, wherein the end queue address is an address of a spare block corresponding to a last turn among the spare blocks.

8. The memory system according to claim 1, wherein the spare blocks are normal blocks.

9. The memory system according to claim 1, wherein the spare blocks are used only to replace the bad block.

10. A method of operating a memory system including memory blocks and spare blocks, the method comprising:
    in response to a detection of a bad block among the memory blocks, reading spare information stored in a memory block among the memory blocks;
    replacing the bad block with any one block of the spare blocks based on whether a start queue address is identical to an end queue address included in the spare information.

11. The method according to claim 10, wherein the start queue address is set to an address of the any one block of the spare blocks.

12. The method according to claim 10, comprising:
    designating the any one block of the spare blocks as the start queue address;
    wherein the any one block of the spare blocks designated as the start queue address is a block to be designated in a first turn as a replacement block among the spare blocks.

13. The method according to claim 10, wherein, in response to the bad block being replaced with the any one block of the spare blocks, a spare block corresponding to a subsequent turn is designated as the start queue address.

14. The method according to claim 10, wherein a block corresponding to a last turn among the spare blocks is designated as the end queue address.

15. The method according to claim 14, comprising:
designating the any one block of the spare blocks as the start queue address;
replacing the bad block with the spare block corresponding to the start queue address in response to the start queue address and the end queue address being not identical with each other; and
processing a plane including the bad block to be a bad plane in response to the start queue address and the end queue address being identical with each other.

16. The method according to claim 10, further comprising, after replacing the bad block with the any one block of the spare blocks, mapping an address of the bad block to an address of the replaced spare block.

\* \* \* \* \*